(12) United States Patent
Xu et al.

(10) Patent No.: US 12,313,653 B2
(45) Date of Patent: May 27, 2025

(54) CARBON NANOMATERIAL FUNCTIONALIZED NEEDLE TIP MODIFIED WITH LOW WORK FUNCTION MATERIAL AND PREPARATION METHOD THEREOF

(71) Applicant: National center for nanoscience and technology, Beijing (CN)

(72) Inventors: Jianxun Xu, Beijing (CN); Yuliang Zhao, Beijing (CN); Yifei Ge, Beijing (CN)

(73) Assignee: National center for nanoscience and technology, Beijing (CN)

( * ) Notice: Subject to any disclaimer, the term of this patent is extended or adjusted under 35 U.S.C. 154(b) by 817 days.

(21) Appl. No.: 17/444,017

(22) Filed: Jul. 29, 2021

(65) Prior Publication Data
US 2022/0308087 A1    Sep. 29, 2022

(30) Foreign Application Priority Data

Mar. 26, 2021 (CN) .......................... 202110328379.9

(51) Int. Cl.
*G01R 1/067* (2006.01)
*B81B 1/00* (2006.01)
(Continued)

(52) U.S. Cl.
CPC ....... *G01R 1/0675* (2013.01); *G01R 1/06738* (2013.01); *H01J 1/3044* (2013.01);
(Continued)

(58) Field of Classification Search
CPC .................. G01Q 70/12; H01J 2201/30426
See application file for complete search history.

(56) References Cited

U.S. PATENT DOCUMENTS

2002/0193040 A1* 12/2002 Zhou ................. H01J 9/025
423/276
2005/0200261 A1    9/2005  Mao et al.
(Continued)

FOREIGN PATENT DOCUMENTS

CN         102530917 A      7/2012
CN         105712281 A      6/2016
(Continued)

OTHER PUBLICATIONS

Communication pursuant to Article 94(3) EPC issued in EP Application No. 21187464.9, dated Mar. 7, 2022.
(Continued)

*Primary Examiner* — Alex A Rolland
(74) *Attorney, Agent, or Firm* — Knobbe, Martens, Olson & Bear, LLP

(57) ABSTRACT

A carbon nanomaterial functionalized needle tip is modified with a low work function material. The needle tip is formed by combining a carbon nanomaterial with a material of a needle tip through a covalent bond. The interior or outer surface of the carbon nanomaterial is modified with a low work function material. The material of the needle tip is a metal which can be any of tungsten, iron, cobalt, nickel, and titanium. The carbon nanomaterial can be carbon nanocone or carbon nanotube. The tip of the carbon nanomaterial has the same orientation as the metal needle tip. The low work function material can be selected from metals, metal carbides, metal oxides, borides, nitrides, and endohedral metallofullerene. The carbon nanomaterial functionalized needle tip has a lower electron emission barrier, and can effectively reduce the electric field intensity required for electron emission, and improve the emission current and emission efficiency.

4 Claims, 11 Drawing Sheets

(51) Int. Cl.
    G01Q 70/12    (2010.01)
    H01J 1/304    (2006.01)
(52) U.S. Cl.
    CPC .............. B81B 1/008 (2013.01); G01Q 70/12 (2013.01); H01J 2201/30415 (2013.01); H01J 2201/30426 (2013.01); H01J 2201/30469 (2013.01)

(56) References Cited

U.S. PATENT DOCUMENTS

| | | | | |
|---|---|---|---|---|
| 2008/0272299 | A1* | 11/2008 | Jin | G01Q 60/56 427/523 |
| 2010/0136869 | A1* | 6/2010 | Aoki | H01J 1/3044 445/51 |
| 2012/0296121 | A1* | 11/2012 | Wigbers | C09C 1/54 564/408 |
| 2019/0107556 | A1* | 4/2019 | Xu | G01Q 70/18 |

FOREIGN PATENT DOCUMENTS

| | | | |
|---|---|---|---|
| CN | 105742139 | A | 7/2016 |
| CN | 107424887 | A | 12/2017 |
| JP | 2006-269443 | A | 10/2006 |
| JP | 2008-297174 | A | 12/2008 |
| JP | 2010-046788 | A | 3/2010 |
| TW | 200945402 | A | 11/2009 |
| WO | WO 2017/140011 | A1 | 8/2017 |

OTHER PUBLICATIONS

Decision to Grant a Patent issued in JP Application No. 2021-131588, dated Dec. 20, 2022.
Dong et al., "In Situ Characterization of Individual Carbon Nanotube Field Emitters with Single Crystalline Cu Tips", Proceedings of the 1$^{st}$ IEEE International Conference on Nano/Micro Engineered and Molecular Systems, Jan. 18-21, 2006, pp. 442-445.
Dongwei et al., "$O_2$ activation on the outer surface of carbon nanotubes modified by encapsulated iron clusters", Applied Surface Science, Feb. 2014, vol. 300, pp. 91-97.
Kim et al., "Electron-emission properties of titanium carbide-coated carbon nanotubes grown on a nano-sized tungsten tip", Thin Solid Films, Dec. 2008, 517(3): 1156-1160.
Notice of Reasons for Refusal issued in JP Application No. 2021-131588, dated Oct. 4, 2022.
Office Action issued in CN Application No. 202110328379.9, dated May 11, 2023.
Qu et al., "Electronic and Field Emission Properties of Carbon Nanocones: A Density Functional Theory Investigation", IEEE Transactions on Nanotechnology, Mar. 2009, 8(2): 153-158.
Search Report issued in CN Application No. 2021103283799.9, dated May 11, 2023.
Houdellier et al., "Development of TEM and SEM high brightness electron guns using cold-filed emission from a carbon nanotip"; Ultramicroscopy, 151, pp. 107-115 (2015).
Zhang et al., "An ultrabright and monochromatic electron point source made of a LaB6 nanowire"; Nature Nanotechnology, vol. 11, pp. 273-279, Mar. 2016.
Slattery et al., "Efficient attachment of carbon nanotubes to conventional and high-frequency AFM probes enhanced by electron beam processes"; Nanotechnology, 24, 235705 (2013).
De Jonge et al., "Carbon nanotube electron souces and applications"; The Royal Society, 362, pp. 2239-2266 (2004).
Swanson et al., "Review of ZrO/W Schottky Cathode"; Handbook of Charged Particle Optics, Second Edition, pp. 1-28.
Hirose et al., "First-principles calculation of the electronic structure for a bielectrode junction system under strong field and current"; The American Physical Society, vol. 51, No. 8, pp. 5278-5290, Feb. 15, 1995.
Kobayashi, "Fist-Principles Study of the Surface Electronic Structures of Transition Metal Carbides"; The Japan Society of Applied Physics, vol. 39, pp. 4311-4314, Jul. 2000.
Narasimba et al., "Ultralow effective work function surfaces using diamondoid monolayers"; Nature Nanotechnology, vol. 11, pp. 267-273, Mar. 2016.
Zhu et al., "Heating graphene to incandescence and the measurement of its work function by the thermionic emission method"; Nano Research, 7 (4), pp. 553-560 (2014).
Xu et al., "Investigation of the crystallization behaviors in a sub-micron space using carbon nanocones"; Royal Society of Chemistry Advances, vol. 7, pp. 50688-50692 (2017).
Gautam et al., "Recent developments in inorganically filled carbon nanotubes: successes and challenges"; Science and Technology of Advanced Materials, vol. 11, 054501, (2010).

* cited by examiner

Fig. 3(a) Fig. 3(b)
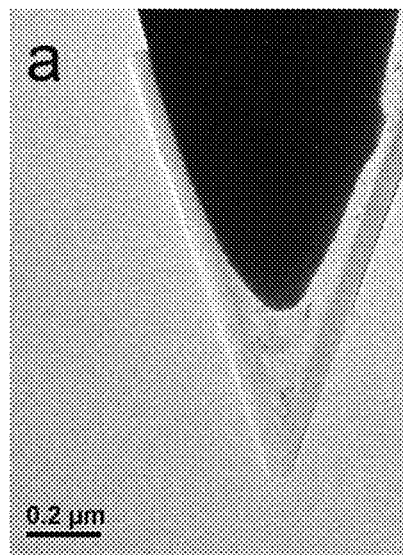
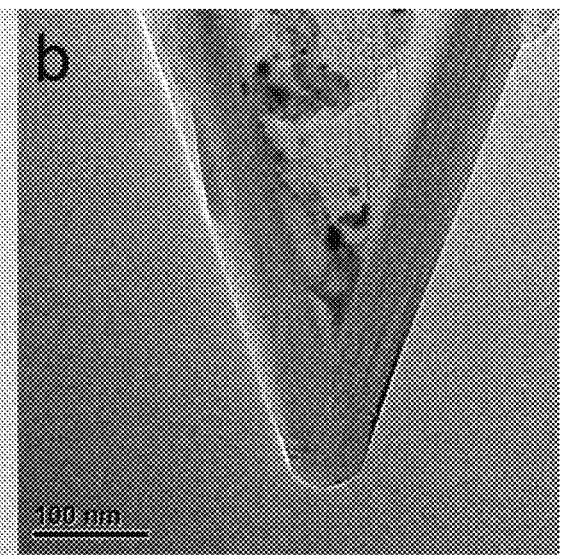
Fig. 3(c)
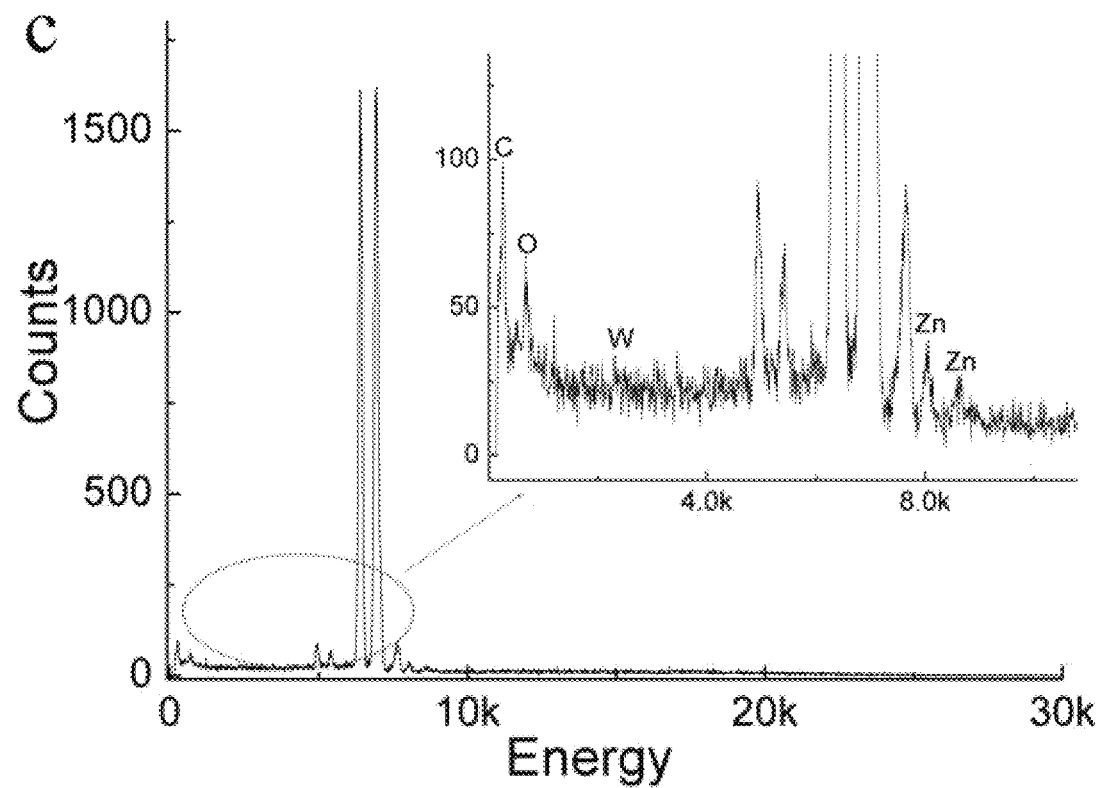

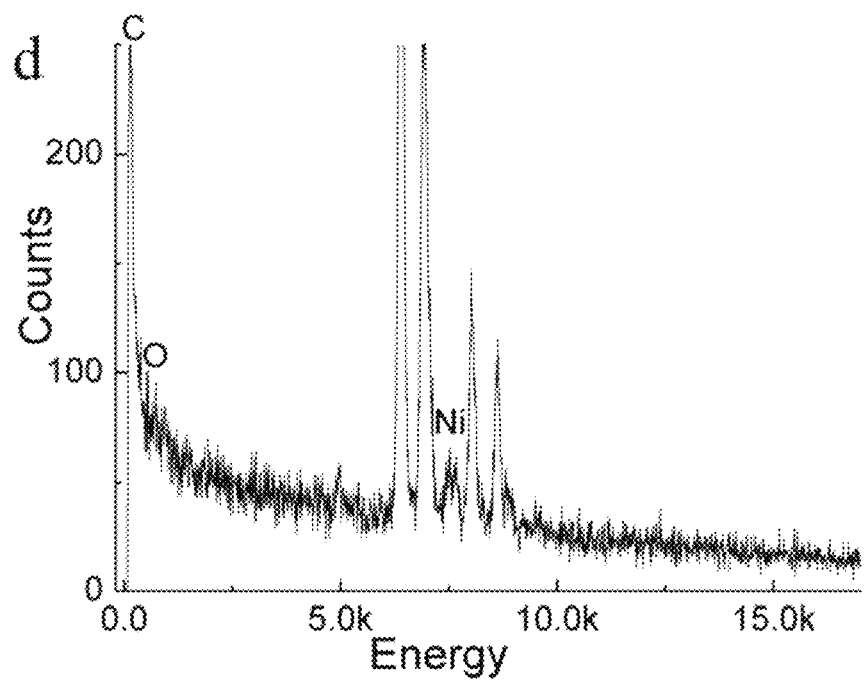

Fig. 7(a)
Fig. 7(b)
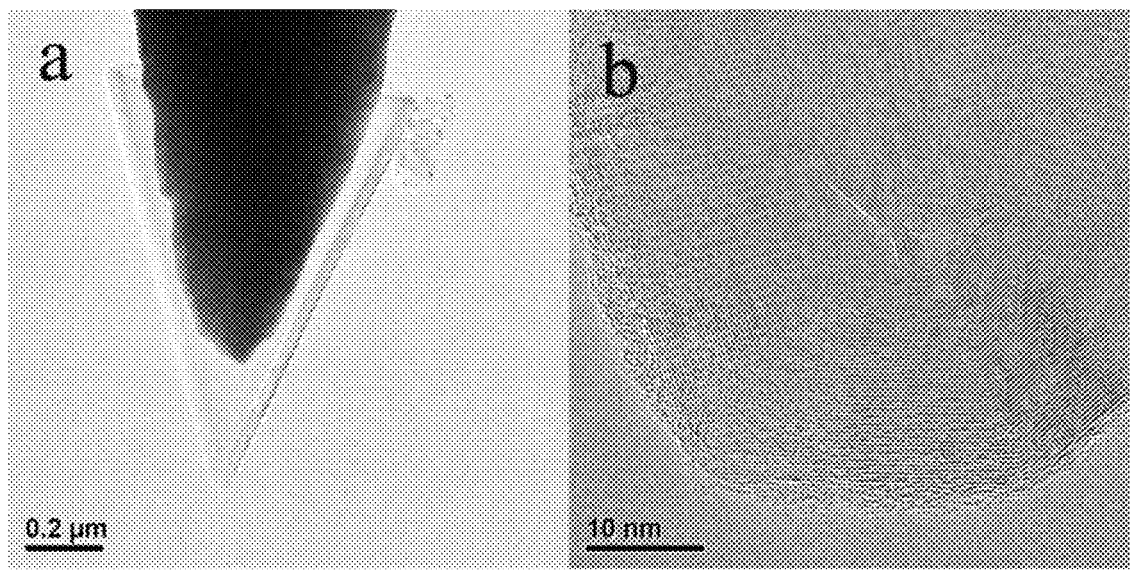
Fig. 7(c)
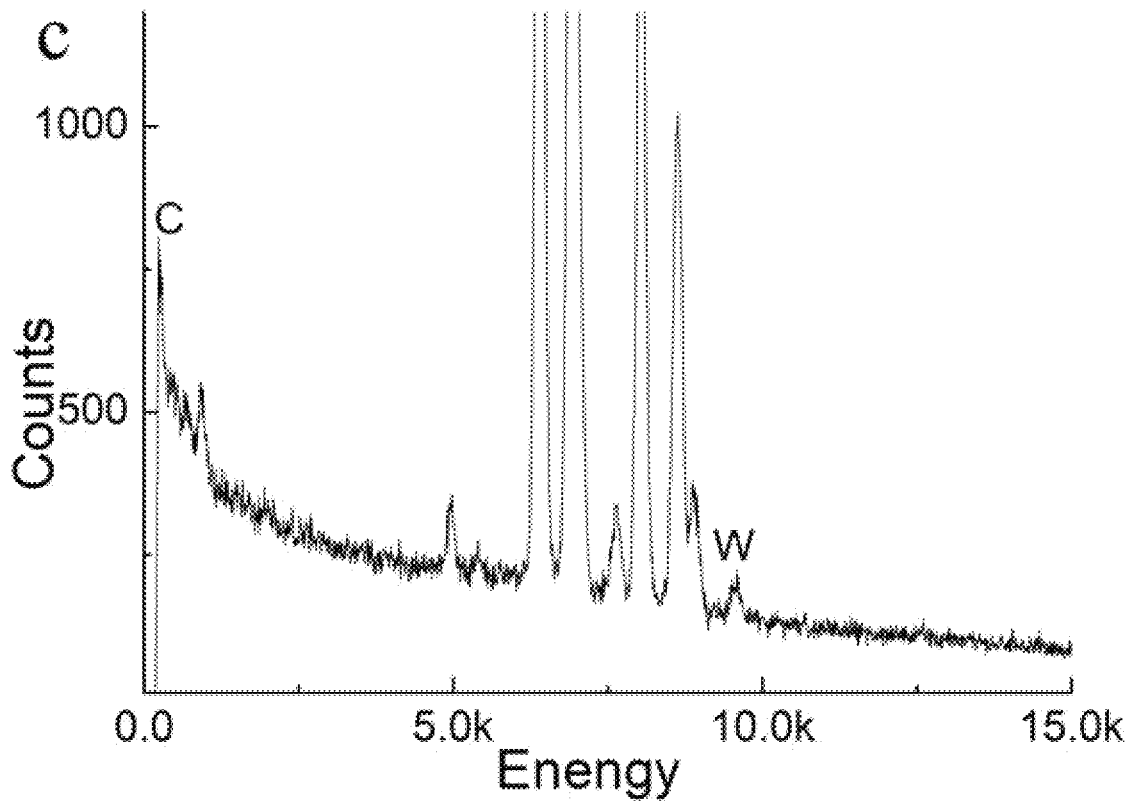

Fig. 9(a)    Fig. 9(b)
Fig. 9(c)
Fig. 9(d)
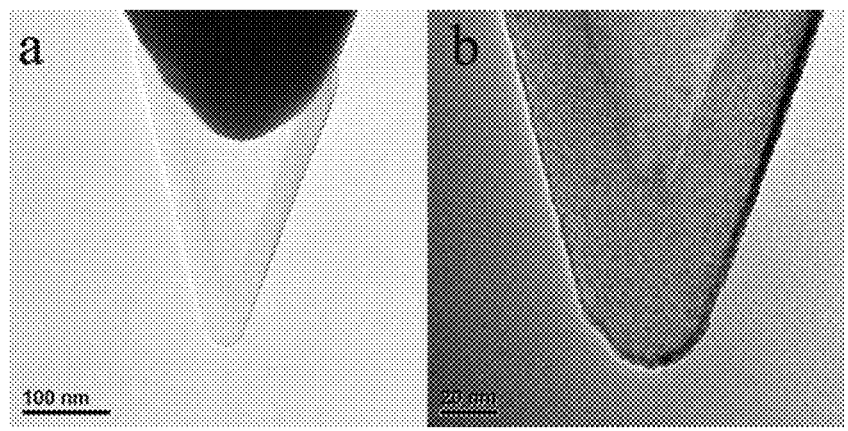
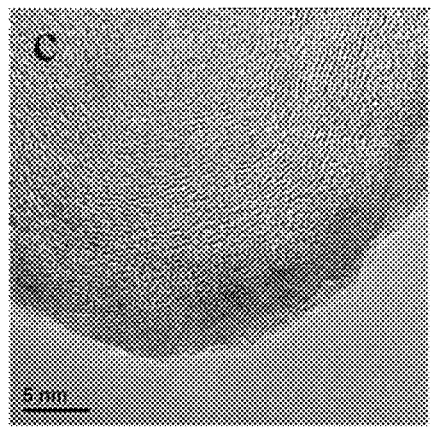
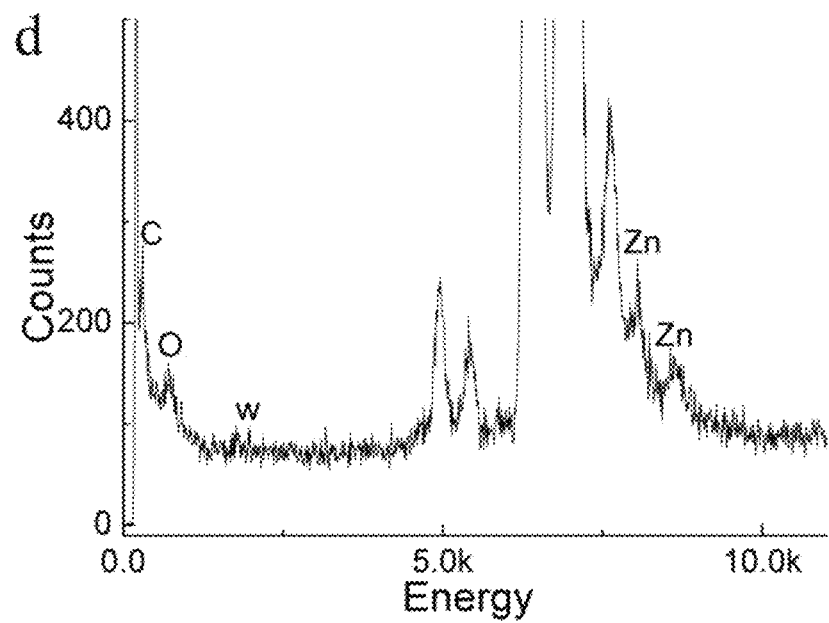

Fig. 10(a)
Fig. 10(b)
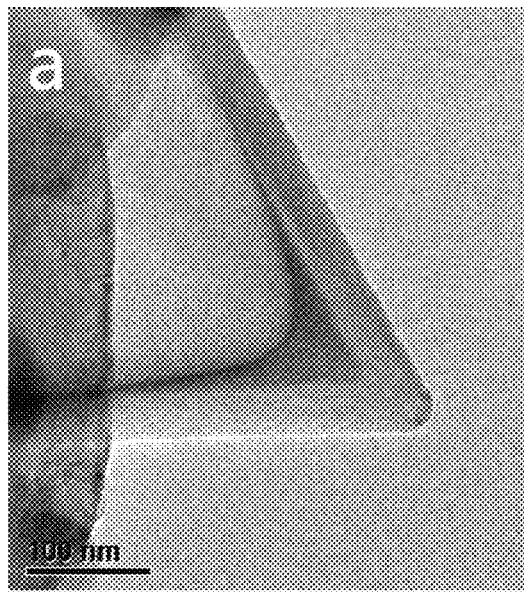 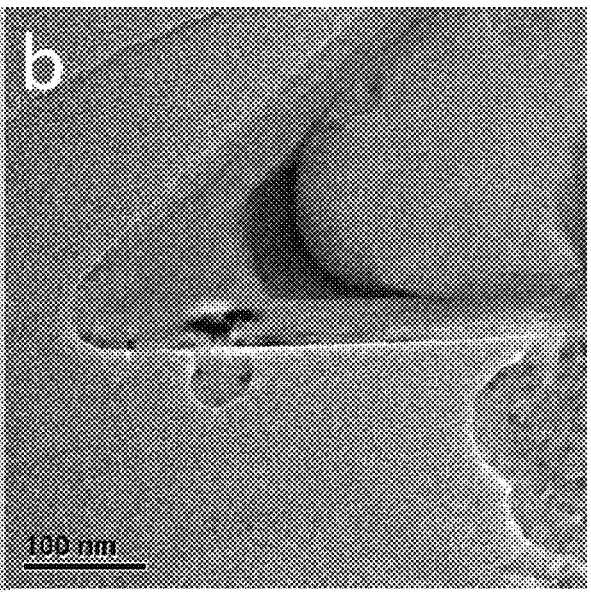
Fig. 10(c)
Fig. 10(d)
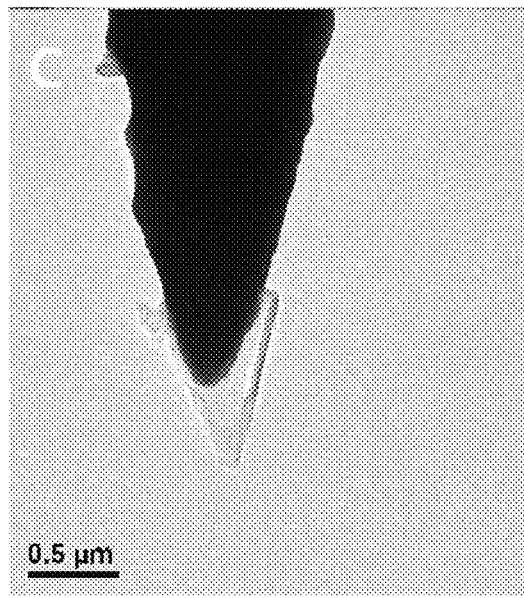 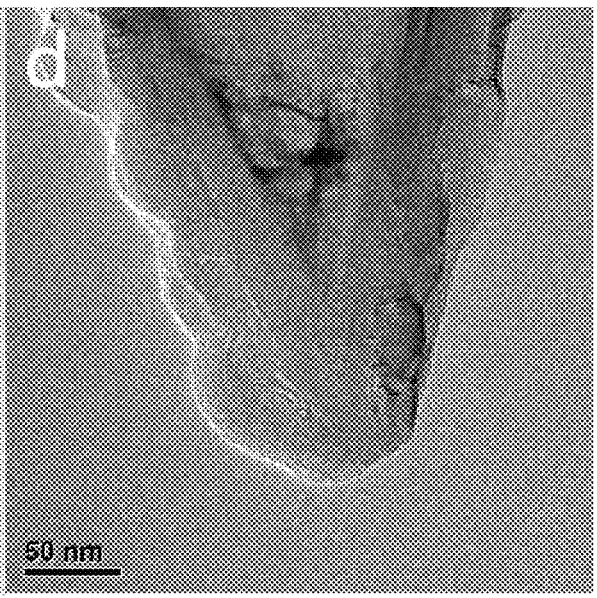

CARBON NANOMATERIAL FUNCTIONALIZED NEEDLE TIP MODIFIED WITH LOW WORK FUNCTION MATERIAL AND PREPARATION METHOD THEREOF

TECHNICAL FIELD

The present invention relates to the field of functionalization of metal materials, and in particular to a carbon nanomaterial functionalized needle tip modified with a low work function material and a preparation method thereof.

BACKGROUND ART

Based on the novel physical and chemical properties of nanomaterials, nanomaterial functionalized needle tips have a wide range of applications in the fields of electron emission sources, scanning probe microscopes, vacuum electronic devices, biomedicines and the like. The conventional nanomaterial functionalized needle tip uses physical adsorption force to adhere nanomaterials (including nanowires, nanotubes and the like) to the tip end of the needle tip[1], and carbon or platinum material is deposited between the nanomaterial and the needle tip substrate for fixation[2-4]. The carbon nanotube functionalized needle tip is prepared by the above method and used for field emission research. The interface between the nanomaterial and metal of this functionalized needle tip has high interface resistance and low mechanical strength, which largely limits the practical applications thereof. Our previous patent document reported a new type of carbon nanocone functionalized needle tip and preparation method therefor[5], in which the carbon nanocone is adhered to the tip end of the metal needle tip substrate by using a micro-nano manipulator, then a covalent bond interface connection between the carbon nanocone and the metal needle tip substrate can be obtained by means of further applying electric current heating or laser irradiation and the like. The carbon nanocone functionalized needle tip prepared by the method has excellent interface performance, low interface contact resistance, and high mechanical strength. The stable and controllable structure of the carbon nanocone functionalized needle tip provides the basis for its practical application in the field of electron emission sources and the like.

For electron emission applications, the work function of the emission material is a very important parameter that affects the performance of electron emission, and a lower work function can effectively improve the electric current density and monochromaticity of the emission beam current. The work function is mainly controlled by structural factors such as material type, surface morphology and crystal orientation. Swanson et al. took the lead in modifying the [100] plane of single crystal W with a zirconia film having a low work function[6], to reduce the work function of single crystal W from 4.5 eV to 2.5 eV, thereby significantly increasing the size of the emission beam current. Later, a titanium oxide film[7] and yttrium oxide film modified emission cathode[8] were also theoretically predicted for the influence of its lower surface work function on electron emission. Recently, Narasimha et al. also reported that the work function of Au material modified with adamantane decreased from 5.1 eV to 1.6 eV, which brought about a significant improvement in its electron emission performance[9].

As mentioned above, the carbon nanocone functionalized needle tip has a stable and controllable structure. However, the tip end of the carbon nanocone is a closed multilayer graphite structure with a high work function (about 4.8 eV)[10], which limits its electron emission performance to a certain extent. One of our previous work reported that a carbon nanocone powder sample with the interior thereof filled with cone-shaped gadolinium oxide was prepared by solvent volatilization method[11], but the work function of gadolinium oxide is high and the electroconductivity thereof is poor, so it cannot be used to prepare a carbon nanocone functionalized needle tip with a low work function. In comparison, some pure metals, metal carbides, borides, nitrides and endohedral metallofullerene (EMF) and the like have lower work function and higher electroconductivity. So far, there are no reports on a carbon nanocone functionalized needle tip modified with such low work function materials. On the other hand, there are many reports on the composite materials of carbon nanotubes modified with metal compounds[12], but there are no reports on a carbon nanotube functionalized needle tip modified with endohedral metallofullerene.

REFERENCES

[1] Houdellier, F., et al., *Development of TEM and SEM high brightness electron guns using cold-field emission from a carbon nanotip*. 2015. 151: p. 107-115.

[2] Zhang, H., et al., *An ultrabright and monochromatic electron point source made of a LaB6 nanowire*. Nature Nanotechnology, 2016. 11(3): p. 273-+.

[3] Slattery, A. D., et al., *Efficient attachment of carbon nanotubes to conventional and high-frequency AFM probes enhanced by electron beam processes*. Nanotechnology, 2013. 24(23).

[4] de Jonge, N. and J. M. Bonard, *Carbon nanotube electron sources and applications*. Philosophical Transactions of the Royal Society a-Mathematical Physical and Engineering Sciences, 2004. 362(1823): p. 2239-2266.

[5] Xu Jianxun, Zhao Yuliang, Tapered Nano-carbon Material Functionalized Needle Tip and Preparation Method Therefor; China patent No. ZL201610091160.0; Tapered Nano-carbon Material Functionalized Needle Tip and Preparation Method Therefor, U.S. Pat. No. 10,823, 758B2.

[6] Swanson, L. W. and G. A. Schwind, *Review of ZrO/W Schottky Cathode*, in *Handbook of Charged Particle Optics*, J. Orloff, Editor. 2009, CRC Press. p. 1.

[7] Hirose, K. and M. Tsukada, *FIRST-PRINCIPLES CALCULATION OF THE ELECTRONIC-STRUCTURE FOR A BIELECTRODE JUNCTION SYSTEM UNDER STRONG-FIELD AND CURRENT* Physical Review B, 1995. 51(8): p. 5278-5290.

[8] Kobayashi, K., *First-principles study of the surface electronic structures of transition metal carbides*. Japanese Journal of Applied Physics Part 1-Regular Papers Brief Communications & Review Papers, 2000. 39(7B): p. 4311-4314.

[9] Narasimha, K. T., et al., *Ultralow effective work function surfaces using diamondoid monolayers*. Nature Nanotechnology, 2016. 11: p. 267-272.

[10] Zhu, F., et al., *Heating graphene to incandescence and the measurement of its work function by the thermionic emission method*. Nano Research, 2014. 7(4): p. 553-560.

[11] Xu, L. L., et al., *Investigation of the crystallization behaviors in a sub-micron space using carbon nanocones*. RSC Adv., 2017. 7: p. 50688.

[12] Gautam, U. K., et al., Recent developments in inorganicallyfilled carbon nanotubes: successes and challenges. Sci. Technol. Adv. Mater., 2010. 11: p.054501.

SUMMARY OF THE INVENTION

The purpose of the present invention is to provide a carbon nanomaterial functionalized needle tip modified with a low work function material. The carbon nanomaterial functionalized needle tip has a lower electron emission barrier, and can effectively reduce the electric field intensity required for electron emission, and improve the emission current and emission efficiency. Another purpose of the present invention is to provide a preparation method of the above-mentioned carbon nanomaterial functionalized needle tip modified with a low work function material.

Specifically, the present invention provides the following technical solutions:

The present invention provides a carbon nanomaterial functionalized needle tip modified with a low work function material, which is formed by combining a carbon nanomaterial with a material of a needle tip by means of a covalent bond; and the interior or outer surface of the carbon nanomaterial is modified with a low work function material.

The material of the needle tip is a metal which is one or more selected from tungsten, iron, cobalt, nickel, and titanium; the carbon nanomaterial is carbon nanocone or carbon nanotube; and the low work function material is one or more selected from metals, metal carbides, metal oxides, borides, nitrides, and endohedral metallofullerene.

The present invention finds that, by modifying the interior or outer surface of the carbon nanomaterial with a low work function material, the carbon nanomaterial functionalized needle tip formed by combining the carbon nanomaterial with the material of the needle tip by means of a covalent bond has a more stable needle tip structure and a lower electron emission barrier compared with other nanomaterial functionalized needle tips in the prior art, and can effectively reduce the electric field intensity required for electron emission, and improve the emission current and emission efficiency.

Preferably, the tip of the carbon nanomaterial has the same orientation as the metal needle tip.

Preferably, the carbon nanocone is a tapered carbon nanomaterial composed of a layered graphite structure.

Preferably, the carbon nanotube is a tubular carbon nanomaterial composed of a layered graphite structure.

Preferably, the low work function material is one or more selected from Ba, Ca, Yb, WC, HfC, NbC, TaC, $Ni_3C$, $LaB_6$, $CeB_6$, TiN, GaN, $Sr_3N_2$, Ca@C82, Lu2C2@C82, Sc3N@C80, BaO, ZnO, and ZrO2.

In the present invention, by selecting suitable low work function materials for modification, the work function of the needle tip can be effectively reduced. Specifically, metals such as Ba, Ca and Yb have relatively low work functions, and can be easily deposited on the surface of the needle tip or carbon nanomaterials by evaporation method. Metal carbides and nitrides, such as WC, HfC, NbC, TaC, $Ni_3C$, TiN, GaN and $Sr_3N2$ have low work functions, and there are many research reports using these materials themselves as electron emission sources (Ishizawa, Y. et al., Appl. Surf. Sci., 1993, 67, 36; Tang, S. et al., Nanoscale, 2020, 12, 16770; Wang, Y. Q. et al., Appl. Surf. Sci., 2013, 285, 115). $LaB_6$ and $CeB_6$ are used as thermal emission electron sources on commercial electron microscopes due to the relatively low work functions thereof. Some low work function metal oxides, such as BaO, $ZrO_2$ and ZnO are also extensively used for thermal emission cathode materials (Yamamoto, S. Rep. Prog. Phys., 2006, 69, 181). Under the preferred conditions of the present invention, the above-mentioned low work function materials form nanoscale films or particles in the interior or on the outer surface of the carbon nanocone or carbon nanotube, and can effectively reduce the work function of the carbon nanomaterial, so that the obtained carbon nanomaterial functionalized needle tip has a relatively low work function.

On the other hand, among the above-mentioned low work function materials, metals, metal carbides, metal nitrides and metal borides are all unstable under the working conditions of electron emission, and the high temperature (usually higher than 1000° C.) of electron emission and high-energy ion bombardment can cause oxidation and structural destruction of the aforementioned low work function materials. Metal oxides are relatively more stable, but may sublime and cause loss at a high temperature, and the low electroconductivity of oxides greatly limits the magnitude of its emission current. Under the optimized conditions of the present invention, the above-mentioned low work function material is located inside the carbon nanomaterial, and the continuous and closed layered graphite structure of the carbon nanomaterial can effectively prevent the oxidation and loss of the internal material. Meanwhile, under preferred conditions, the metal oxide exists in the form of nanoparticles or nano-films in the carbon nanomaterial, and a good electrical contact is formed between the metal oxide and carbon nanomaterial, which can effectively overcome the disadvantage of poor electroconductivity of the metal oxide. Meanwhile, the prepared functionalized needle tip has a firm covalent bond interface connection between the carbon nanomaterial and the metal needle tip, and has excellent mechanical and electrical properties, thus endowing the functionalized needle tip with a stable structure and protecting low work function materials.

Endohedral metallofullerene are a kind of compounds in which metal, metal carbide or nitride molecular clusters are encapsulated in a fullerene carbon cage. Similar to the above-mentioned materials, its internal low work function molecular clusters can also reduce the work function of the carbon nanomaterial, and the carbon nanomaterial can provide better protecting and supporting effects for the endohedral metallofullerene.

Preferably, the needle tip has a conventional needle tip shape, and the apex angle of the tip end is 10° to 70°.

Preferably, the tip portion of the needle tip is completely covered by a single carbon nanocone, and the tail of the carbon nanocone covers the tip end of the needle tip.

Preferably, the tip portion of the needle tip is modified by a single carbon nanotube cluster or a single carbon nanotube.

The present invention also provides a preparation method of the carbon nanomaterial functionalized needle tip modified with a low work function material.

Specifically, the preparation method of the present invention can be divided into two parallel technical solutions according to the portions modified by the low work function material.

As one of the technical solutions:

When the interior of the carbon nanomaterial is modified with a low work function material, the preparation method of the present invention is divided into two operation modes, which are specifically as follows:

(I) The preparation method comprises the following steps:
(1) modifying the surface of the needle tip with a low work function material; and (2) assembling the carbon nanomaterial to the tip end of the needle tip with the surface thereof modified with the low work function material, and forming a firm interface connection between the carbon nanomaterial and the tip end of the needle tip by applying electric current or laser irradiation.

Preferably, in step (1), an ion sputtering method, an evaporation method, a vapor deposition method or an electroplating method is used to modify the surface of the needle tip with a 1 to 100 nm thick low work function material.

In a specific embodiment, an evaporation method is adopted. A needle tip of a suitable material is selected and fixed on a sample stage of an equipment, and a target material or powder of a low work function material is installed in the vacuum chamber of the equipment and excited by high-energy electron beams under suitable working conditions to enter the vapor phase and deposited on the surface of the needle tip.

Preferably, in step (2), depositing the carbon nanomaterial on a silicon wafer substrate by using a spin coater; adhering the tip end of the needle tip with the surface thereof modified with the low work function material to the carbon nanomaterial, contacting the needle body with another metal body, applying a voltage between the metal body and the needle body, so that an electric current passes through the needle body, and the tip portion of the needle is heated and bonded with the adhered carbon nanomaterial.

Further, the metal body has a spherical or platform-shaped top end; the position where the metal body contacts with the needle body is 0.2 to 100 μm away from the tip end of the needle tip; the material of both the metal body and the needle tip end is tungsten; and the electric current passing through the needle body is 0.04 to 4 A.

(II) The preparation method comprises the following steps:
(1) filling the interior of the carbon nanomaterial with a low work function material; and
(2) assembling the carbon nanomaterial internally filled with the low work function material to the tip end of the needle tip, and forming a firm interface connection between the carbon nanomaterial and the tip end of the needle tip by applying an electric current or laser irradiation.

Preferably, in step (1), a vacuum gas-phase filling method, a melt-phase filling method or a solution filling method is used to fill the interior of the carbon nanomaterial with a low work function material; and the specific operation is as follows:
placing the carbon nanomaterial powder in a reactor, mixing and contacting with the vapor, molten liquid or solution of the compound of the low work function material, reacting for 2 to 36 h, then washing off the low work function material not filled into the carbon nanomaterial with a solvent, filtering by suction and drying the resultant.

Preferably, in step (2), depositing the carbon nanomaterial with the interior thereof filled with the low work function material on a silicon wafer substrate by using a spin coater; adhering the tip end of the needle tip to the carbon nanomaterial, contacting the needle body with another metal body, applying a voltage between the metal body and the needle body, so that an electric current passes through the needle body, and the tip portion of the needle is heated and bonded with the adhered carbon nanomaterial.

Further, the metal body has a spherical or platform-shaped top end; the position where the metal body contacts with the needle body is 0.2 to 100 μm away from the tip end of the needle tip; the material of both the metal body and the needle tip end is tungsten; and the electric current passing through the needle body is 0.04 to 4 A.

As the second technical solution:

When the outer surface of the carbon nanomaterial functionalized needle tip is modified with a low work function material, the preparation method of the present invention comprises the following steps:
(1) assembling the carbon nanomaterial to the tip end of the needle tip, and forming a firm interface connection between the carbon nanomaterial and the tip end of the needle tip by applying an electric current or laser irradiation to obtain a carbon nanomaterial functionalized needle tip; and
(2) modifying the outer surface of the carbon nanomaterial functionalized needle tip with a low work function material.

Preferably, in step (1), depositing the carbon nanomaterial on a silicon wafer substrate by using a spin coater; adhering the tip end of the needle tip to the carbon nanomaterial, contacting the needle body with another metal body, applying a voltage between the metal body and the needle body, so that an electric current passes through the needle body, and the tip portion of the needle is heated and bonded with the adhered carbon nanomaterial;
wherein, the metal body has a spherical or platform-shaped top end; the position where the metal body contacts with the needle body is 0.2 to 100 μm away from the tip end of the needle tip; the material of both the metal body and the needle tip end is tungsten; and the electric current passing through the needle body is 0.04 to 4 A.

Preferably, in step (2), an ion sputtering method, an evaporation method, a vapor deposition method, or an electroplating method is used to modify the outer surface of the carbon nanomaterial functionalized needle tip with a 1 to 100 nm thick low work function material.

In a specific embodiment, an evaporation method is adopted. A needle tip of a suitable material is selected and fixed on a sample stage of an equipment, and a target material or powder of the low work function material is installed in the vacuum chamber of the equipment and excited by high-energy electron beams under suitable working conditions to enter the vapor phase and deposited on the outer surface of the carbon nanomaterial functionalized needle tip.

The beneficial effects of the present invention are as follows:

The carbon nanomaterial functionalized needle tip modified with a low work function material provided by the present invention not only has a lower work function than the carbon nanomaterial itself, but also has a more stable structure than the low work function material, thus effectively improving the electron emission performance, stability and lifetime of the needle tip.

BRIEF DESCRIPTION OF THE DRAWINGS

FIG. 3(a) and FIG. 3(b) show transmission electron microscope images of a carbon nanocone functionalized needle tip modified with a low work function metal oxide ZnO prepared after depositing a ZnO film on the tip end of a metal tungsten needle tip. FIG. 3(c) shows energy spectrum of a carbon nanocone functionalized needle tip modified with a low work function metal oxide ZnO prepared after depositing a ZnO film on the tip end of a metal tungsten needle tip FIG. 4(a), FIG. 4(b) and FIG. 4(c) show transmission electron microscope images.

FIG. 5(a), FIG. 5(b) and FIG. 5(c) show transmission electron microscope images, FIG. 5(d) shows the corresponding energy spectrum of a carbon nanocone functionalized needle tip modified with a low work function metal carbide $Ni_3C$ prepared after depositing a $Ni_3C$ film on the tip end of a metal tungsten needle tip.

FIG. 7(a) and FIG. 7(b) show transmission electron microscope images, FIG. 7(c) shows the corresponding energy spectrum of a carbon nanocone functionalized needle tip modified with a low work function metal carbide WC prepared after electron beam deposition of a C film on the tip end of a metal tungsten needle tip.

FIG. 9(a), FIG. 9(b) and FIG. 9(c) show transmission electron microscope images, FIG. 9(d) shows the corresponding energy spectrum of a carbon nanocone functionalized needle tip coated with a low work function metal oxide ZnO film on the outer surface thereof.

FIG. 10(a) and FIG. 10(b) show transmission electron microscope images of a carbon nanocone tip end filled with scandium acetate by a solution filling method, and FIG. 10(c) and FIG. 10(d) show transmission electron microscope images of the corresponding scandium oxide-filled carbon nanocone functionalized nano-needle tip.

SPECIFIC MODES FOR CARRYING OUT THE EMBODIMENTS

The present invention will be further described in combination with specific Examples as follows. It should be pointed out that the following Examples are only used to illustrate specific implementation methods of the present invention, but not intended to limit the scope of protection of claims of the present invention.

The micro manipulator arms used in the Examples are products of Kleindiek Nanotechnik Company, the scanning microscope is FEI Quanta 200 FEG, and the type of the transmission electron microscope is FEI F20.

The spin coater is a KW-4A type spin coater produced by the Institute of Microelectronics of the Chinese Academy of Sciences.

The magnetron sputtering coating system is Lab-18.

The electron beam evaporation coating system is OHM-IKER-50B.

The heating and stirring device is MS-H-PRO.

The digital display infrared baking lamp is LP23030-B.

Example 1

In the present Example, a metal W needle tip was coated with a 5 nm thick Ba film (purity of Ba target material: 99.99%) on the surface by an electron beam evaporation coating method, and numbered as #2. A carbon nanocone material was dispersed in o-dichlorobenzene solvent by ultrasonic, and the obtained dispersion was deposited on a silicon wafer substrate by using a spin coater, then the silicon wafer substrate was mounted on a sample stage 3 of a scanning electron microscope, and the tungsten needle tips #1 and #2 were installed on a needle tube at the front end of the micro manipulator arms 1 and 2 in FIG. 1(a), respectively. The three-dimensional spatial movement of the tungsten needle tips in the sample chamber of the scanning electron microscope was realized by controlling the micro manipulator arms.

The tungsten needle tip #1 was moved, so that the tip end of the tungsten needle tip #1 lightly touched the tungsten needle tip #2 at the position 50 μm away from the tip end of the tungsten needle tip #2 to form a path. The tip end of the tungsten needle tip #1 was immediately melted into a 2 μm spherical structure by applying a bias voltage of 50 V. Then, the tungsten needle tip #2 was controlled by the micro manipulator arm such that the needle tip slowly approached the carbon nanocone deposited on the substrate, to be inserted into the tail of a carbon nanocone, and the needle tip was lifted upward such that the carbon nanocone slowly left the substrate. The molten tungsten metal spherical surface of the tungsten needle tip #1 was brought into contact with the side of the metal needle tip #2 at the position 2 μm away from the tip end of the metal needle tip #2 through the micro manipulator arm. A voltage was applied to the two tungsten needle tips to generate an electric current of 3 A for 0.25 ms.

Figures 2A, 2B:
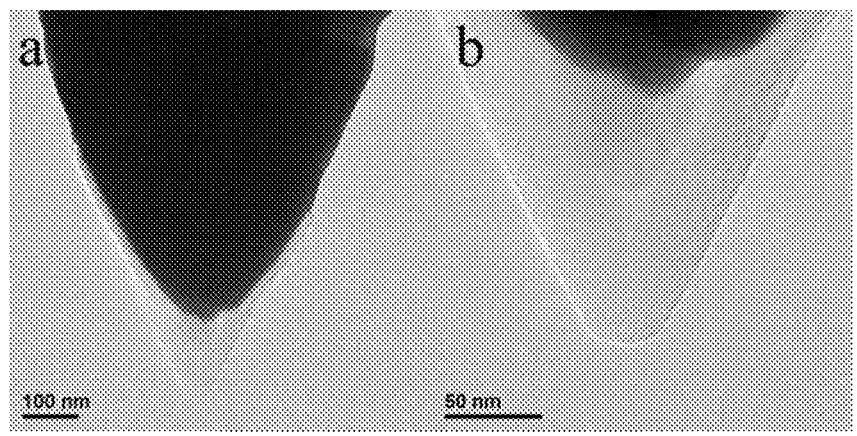
FIG. 2(a), FIG. 2(b) and FIG. 2(c) show transmission electron microscope images.
Figure 2C:
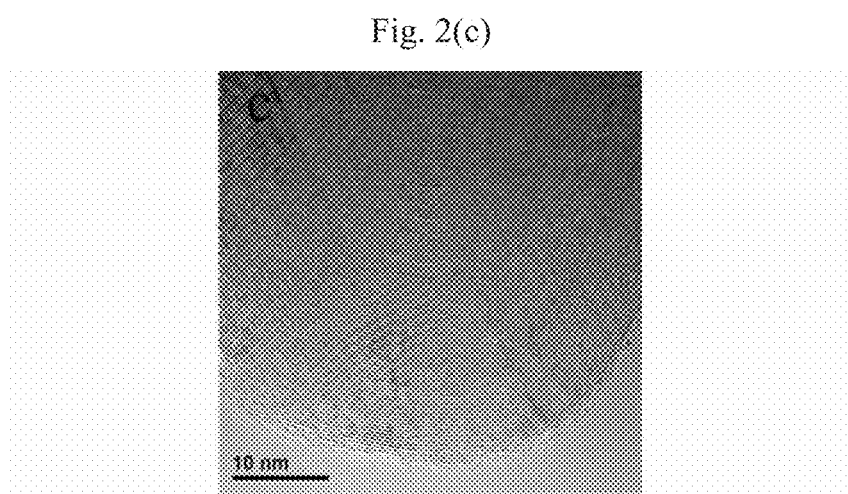
Figure 2D:
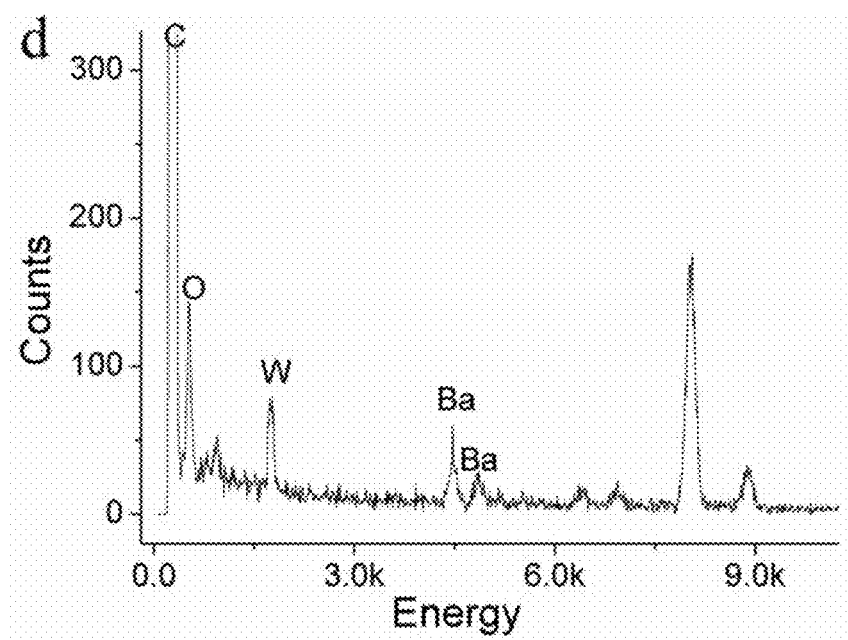
FIG. 2(d) shows the corresponding energy spectrum of a carbon nanocone functionalized needle tip modified with low work function metal Ba after depositing a Ba film on the tip end of a metal tungsten needle tip.

FIG. 2(a), FIG. 2(b) and FIG. 2(c) show transmission electron microscope (TEM) photos of the present Example. The high-resolution image in FIG. 2(b) shows that the prepared functionalized needle tip has a structure comprising sequentially a carbon nanocone, a Ba coating layer, and a W needle tip from the outside to the inside, and the carbon nanocone-shaped structure does not change when the tip end of the tungsten needle tip is melted, which indirectly indicates the stability of its structure. The result of X-ray energy spectroscopy (EDX) analysis in FIG. 2(d) confirms the existence of the filler Ba.

Example 2

In the present Example, a metal W needle tip was coated with a 5 nm thick ZnO film (purity of magnetron sputtering ZnO target material: 99.99%) on the surface by a magnetron sputtering coating method, and numbered as #2. A carbon nanocone material was dispersed in o-dichlorobenzene solvent by ultrasonic, and the obtained dispersion was deposited on a silicon wafer substrate by using a spin coater, then the silicon wafer substrate was mounted on a sample stage 3 of a scanning electron microscope, and the tungsten needle tips #1 and #2 were installed on a needle tube at the front end of the micro manipulator arms 1 and 2 in FIG. 1(a), respectively. The three-dimensional spatial movement of the tungsten needle tips in the sample chamber of the scanning electron microscope was realized by controlling the micro manipulator arms.

The tungsten needle tip #1 was moved, so that the tip end of the tungsten needle tip #1 lightly touched the tungsten needle tip #2 at the position 50 μm away from the tip end of the tungsten needle tip #2 to form a path. The tip end of the tungsten needle tip #1 was immediately melted into a 2 μm spherical structure by applying a bias voltage of 50 V. Then, the tungsten needle tip #2 was controlled by the micro manipulator arm such that the needle tip slowly approached the carbon nanocone deposited on the substrate, to be inserted into the tail of a carbon nanocone, and the needle tip was lifted upward such that the carbon nanocone slowly left the substrate. The molten tungsten metal spherical surface of the tungsten needle tip #1 was brought into contact with the side of the metal needle tip #2 at the position 2 μm away from the tip end of the metal needle tip #2 through the micro manipulator arm. A voltage was applied to the two tungsten needle tips to generate an electric current of 3 A for 0.2 ms.

FIG. 3(a) and FIG. 3(b) show TEM photos of the present Example. The high-resolution image shows that the prepared functionalized needle tip has a structure comprising sequentially a carbon nanocone, ZnO nanoparticles, and a W needle tip from the outside to the inside, and the carbon nanocone-shaped structure does not change when the tip end of the tungsten needle tip is melted, which indirectly indicates the stability of its structure. The result of X-ray energy spectroscopy (EDX) analysis in FIG. 3(c) confirms the existence of the filler ZnO. The ZnO obtained in the present Example exists in the form of nanoparticles on the inner surface of the carbon nanocone, and forms a good contact with the carbon nanocone.

Example 3

In the present Example, a metal W needle tip was coated with a 5 nm thick LaB6 film (purity of $LaB_6$ target material: 99.99%) on the surface by an electron beam evaporation coating method, and numbered as #2. A carbon nanocone material was dispersed in o-dichlorobenzene solvent by ultrasonic, and the obtained dispersion was deposited on a silicon wafer substrate by using a spin coater, then the silicon wafer substrate was mounted on a sample stage 3 of a scanning electron microscope, and the tungsten needle tips #1 and #2 were installed on a needle tube at the front end of the micro manipulator arms 1 and 2 in FIG. 1(a), respectively. The three-dimensional spatial movement of the tungsten needle tips in the sample chamber of the scanning electron microscope was realized by controlling the micro manipulator arms.

The tungsten needle tip #1 was moved, so that the tip end of the tungsten needle tip #1 lightly touched the tungsten needle tip #2 at the position 50 μm away from the tip end of the tungsten needle tip #2 to form a path. The tip end of the tungsten needle tip #1 was immediately melted into a 2 μm spherical structure by applying a bias voltage of 50 V. Then, the tungsten needle tip #2 was controlled by the micro manipulator arm such that the needle tip slowly approached the carbon nanocone deposited on the substrate, to be inserted into the tail of a carbon nanocone, and the needle tip was lifted upward such that the carbon nanocone slowly left the substrate. The molten tungsten metal spherical surface of the tungsten needle tip #1 was brought into contact with the side of the metal needle tip #2 at the position 2 μm away from the tip end of the metal needle tip #2 through the micro manipulator arm. A voltage was applied to the two tungsten needle tips to generate an electric current of 3 A for 0.25 ms.

Figures 4, 4B:
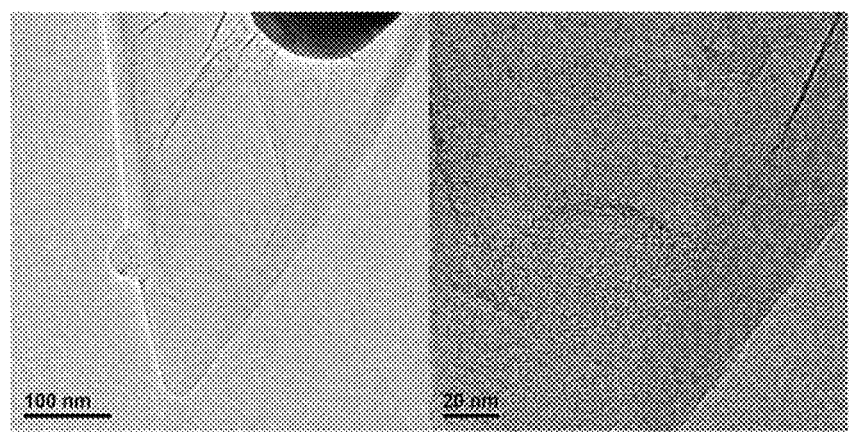
Figure 4C:
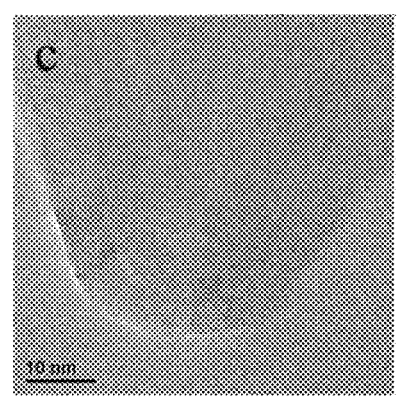
Figure 4D:
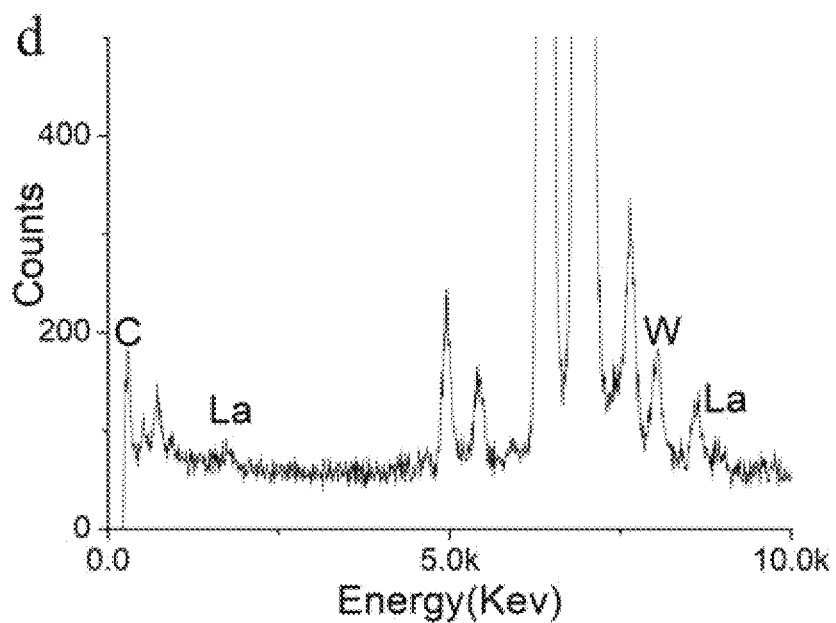
FIG. 4(d) shows the corresponding energy spectrum of a carbon nanocone functionalized needle tip modified with a low work function metal boride $LaB_6$ prepared after depositing a $LaB_6$ film on the tip end of a metal tungsten needle tip.

FIG. 4(a), FIG. 4(b) and FIG. 4(c) shows TEM photos of the present Example. The high-resolution image in FIG. 4(b) shows that the prepared functionalized nano probe has a structure comprising sequentially a carbon nanocone, LaB6, and a W needle tip from the outside to the inside. The result of X-ray energy spectroscopy (EDX) analysis in FIG. 4(d) confirms the existence of the filler $LaB_6$.

Example 4

In the present Example, a metal W needle tip was coated with a 5 nm thick nickel carbide film (purity of magnetron sputtering nickel carbide target material: 99.99%) on the surface by a magnetron sputtering coating method, and numbered as #2. A carbon nanocone material was dispersed in o-dichlorobenzene solvent by ultrasonic, and the obtained dispersion was deposited on a silicon wafer substrate by using a spin coater, then the silicon wafer substrate was mounted on a sample stage 3 of a scanning electron microscope, and the tungsten needle tips #1 and #2 were installed on a needle tube at the front end of the micro manipulator arms 1 and 2 in FIG. 1(a), respectively. The three-dimensional spatial movement of the tungsten needle tips in the sample chamber of the scanning electron microscope was realized by controlling the micro manipulator arms.

The tungsten needle tip #1 was moved, so that the tip end of the tungsten needle tip #1 lightly touched the tungsten needle tip #2 at the position 50 μm away from the tip end of the tungsten needle tip #2 to form a path. The tip end of the tungsten needle tip #1 was immediately melted into a 2 μm spherical structure by applying a bias voltage of 50 V. Then, the tungsten needle tip #2 was controlled by the micro manipulator arm such that the needle tip slowly approached the carbon nanocone deposited on the substrate, to be inserted into the tail of a carbon nanocone, and the needle tip was lifted upward such that the carbon nanocone slowly left the substrate. The molten tungsten metal spherical surface of the tungsten needle tip #1 was brought into contact with the side of the metal needle tip #2 at the position 2 μm away from the tip end of the metal needle tip #2 through the micro manipulator arm. A voltage was applied to the two tungsten needle tips to generate an electric current of 3 A for 0.25 ms.

Figures 5, 5B:
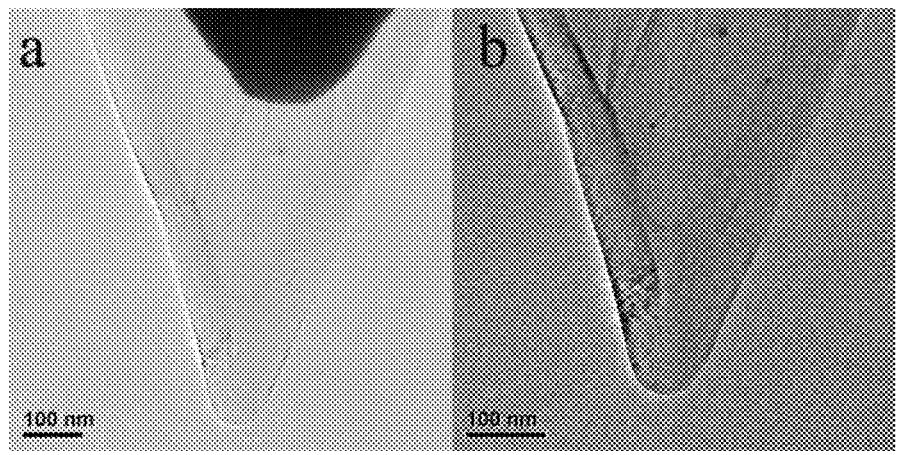
Figure 5C:
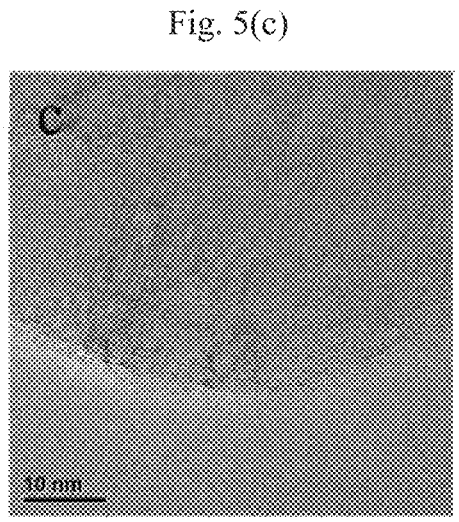

FIG. 5(a), FIG. 5(b) and FIG. 5(c) show TEM photos of the present Example. The high-resolution image in FIG. 5(b) shows that the prepared functionalized nano probe has a structure comprising sequentially a carbon nanocone, nickel carbide, and a W needle tip from the outside to the inside. The result of X-ray energy spectroscopy (EDX) analysis in FIG. 5(d) confirms the existence of the filler nickel carbide.

Example 5

In the present Example, a metal W needle tip was coated with a 5 nm thick TaC film (purity of TaC target material: 99.99%) on the surface by a magnetron sputtering coating method, and numbered as #2. A carbon nanocone material was dispersed in o-dichlorobenzene solvent by ultrasonic, and the obtained dispersion was deposited on a silicon wafer substrate by using a spin coater, then the silicon wafer substrate was mounted on a sample stage 3 of a scanning electron microscope, and the tungsten needle tips #1 and #2 were installed on a needle tube at the front end of the micro manipulator arms 1 and 2 in FIG. 1(a), respectively. The three-dimensional spatial movement of the tungsten needle tips in the sample chamber of the scanning electron microscope was realized by controlling the micro manipulator arms.

The tungsten needle tip #1 was moved, so that the tip end of the tungsten needle tip #1 lightly touched the tungsten needle tip #2 at the position 50 μm away from the tip end of the tungsten needle tip #2 to form a path. The tip end of the tungsten needle tip #1 was immediately melted into a 2 μm spherical structure by applying a bias voltage of 50 V. Then, the tungsten needle tip #2 was controlled by the micro manipulator arm such that the needle tip slowly approached the carbon nanocone deposited on the substrate, to be inserted into the tail of a carbon nanocone, and the needle tip was lifted upward such that the carbon nanocone slowly left the substrate. The molten tungsten metal spherical surface of the tungsten needle tip #1 was brought into contact with the side of the metal needle tip #2 at the position 2 μm away from the tip end of the metal needle tip #2 through the micro manipulator arm. A voltage was applied to the two tungsten needle tips to generate an electric current of 3 A for 0.25 ms.

Figures 6A, 6B:
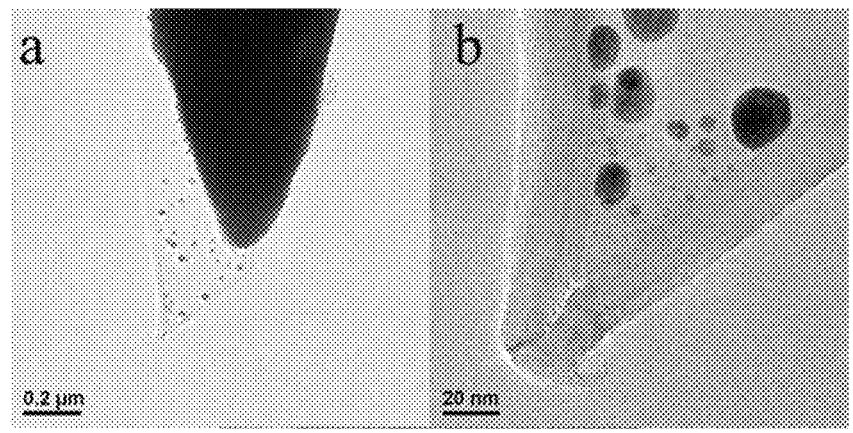
FIG. 6(a), FIG. 6(b) and FIG. 6(c) show transmission electron microscope images.
Figure 6C:
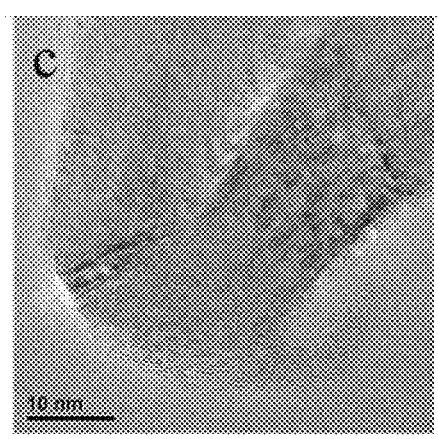
Figure 6D:
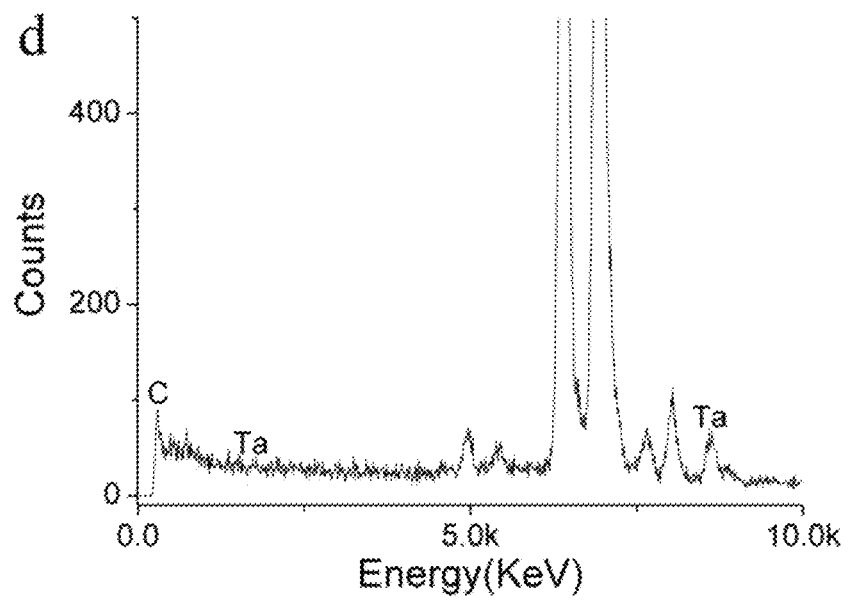
FIG. 6(d) shows the corresponding energy spectrum of a carbon nanocone functionalized needle tip modified with a low work function metal carbide TaC prepared after depositing a TaC film on the tip end of a metal tungsten needle tip.

FIG. 6(a), FIG. 6(b) and FIG. 6(c) show TEM photos of the present Example. The high-resolution image in FIG. 6(b) shows that the prepared functionalized nano probe has a structure comprising sequentially a carbon nanocone, TaC, and a W needle tip from the outside to the inside. The result of X-ray energy spectroscopy (EDX) analysis in FIG. 6(d) confirms the existence of the filler TaC. The TaC obtained in the present Example exists in the form of nanoparticles on the inner surface of the carbon nanocone, and forms a good contact with the carbon nanocone.

Example 6

In the present Example, a metal W needle tip was coated with a 5 nm thick carbon on the surface by an electron beam induced carbon deposition method under a scanning electron microscope, and numbered as #2. A carbon nanocone material was dispersed in o-dichlorobenzene solvent by ultrasonic, and the obtained dispersion was deposited on a silicon wafer substrate by using a spin coater, then the silicon wafer substrate was mounted on a sample stage 3 of a scanning electron microscope, and the tungsten needle tips #1 and #2 were installed on a needle tube at the front end of the micro manipulator arms 1 and 2 in FIG. 1(a), respectively. The three-dimensional spatial movement of the tungsten needle tips in the sample chamber of the scanning electron microscope was realized by controlling the micro manipulator arms.

The tungsten needle tip #1 was moved, so that the tip end of the tungsten needle tip #1 lightly touched the tungsten needle tip #2 at the position 50 μm away from the top of the tungsten needle tip #2 to form a path. The tip end of the tungsten needle tip #1 was immediately melted into a 2 μm spherical structure by applying a bias voltage of 50 V. Then, the tungsten needle tip #2 was controlled by the micro manipulator arm such that the needle tip slowly approached the carbon nanocone deposited on the substrate, to be inserted into the tail of a carbon nanocone, and the needle tip was lifted upward such that the carbon nanocone slowly left the substrate. The molten tungsten metal spherical surface of the tungsten needle tip #1 was brought into contact with the side of the metal needle tip #2 at the position 2 μm away from the tip end of the metal needle tip #2 through the micro manipulator arm. A voltage was applied to the two tungsten needle tips to generate an electric current of 3 A for 0.25 ms.

FIG. 7(a) and FIG. 7(b) show TEM photos of the present Example. The high-resolution image in FIG. 7(b) shows the prepared tungsten carbide modified carbon nanocone functionalized nano probe. The result of X-ray energy spectroscopy (EDX) analysis in FIG. 7(c) confirms the existence of W and C.

Example 7

In the present Example, a metal W needle tip was coated with a 5 nm thick TiN film (magnetron sputtering TiN target material: 99.99%) on the surface by a magnetron sputtering coating method, and numbered as #2. A carbon nanocone material was dispersed in o-dichlorobenzene solvent by ultrasonic, and the obtained dispersion was deposited on a silicon wafer substrate by using a spin coater, then the silicon wafer substrate was mounted on a sample stage 3 of a scanning electron microscope, and the tungsten needle tips #1 and #2 were installed on a needle tube at the front end of the micro manipulator arms 1 and 2 in FIG. 1(a), respectively. The three-dimensional spatial movement of the tungsten needle tips in the sample chamber of the scanning electron microscope was realized by controlling the micro manipulator arms.

The tungsten needle tip #1 was moved, so that the tip end of the tungsten needle tip #1 lightly touched the tungsten needle tip #2 at the position 50 μm away from the tip end of the tungsten needle tip #2 to form a path. The tip end of the tungsten needle tip #1 was immediately melted into a 2 μm spherical structure by applying a bias voltage of 50 V. Then, the tungsten needle tip #2 was controlled by the micro manipulator arm such that the needle tip slowly approached the carbon nanocone deposited on the substrate, to be inserted into the tail of a carbon nanocone, and the needle tip was lifted upward such that the carbon nanocone slowly left the substrate. The molten tungsten metal spherical surface of the tungsten needle tip #1 was brought into contact with the side of the metal needle tip #2 at the position 2 μm away from the tip end of the metal needle tip #2 through the micro manipulator arm. A voltage was applied to the two tungsten needle tips to generate an electric current of 3 A for 0.25 ms.

Figures 8A, 8B:
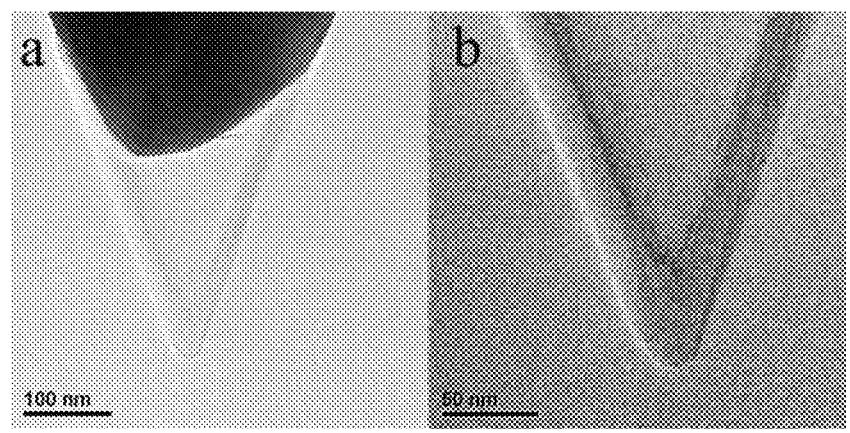
FIG. 8(a), FIG. 8(b) and FIG. 8(c) show transmission electron microscope images.
Figure 8C:
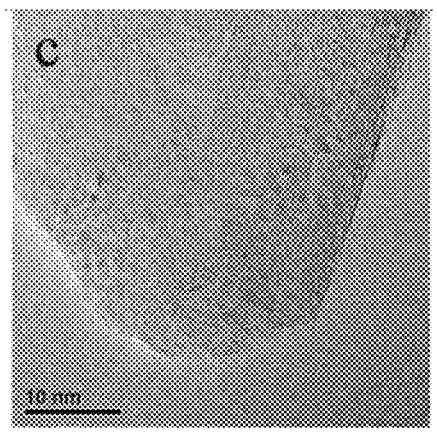
Figure 8D:
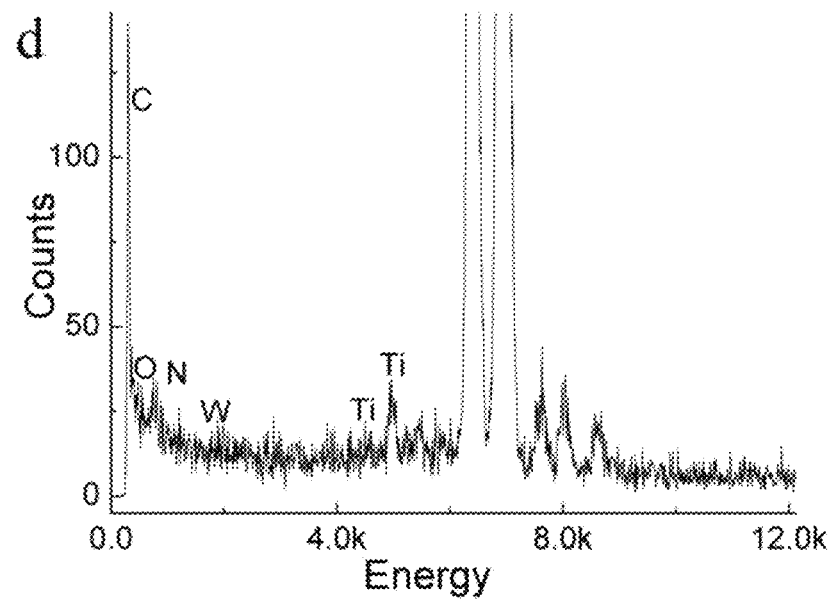
FIG. 8(d) shows the corresponding energy spectrum of a carbon nanocone functionalized needle tip modified with a low work function metal nitride TiN prepared after depositing a TiN film on the tip end of a metal tungsten needle tip.

FIG. 8(a), FIG. 8(b) and FIG. 8(c) show TEM photos of the present Example. The high-resolution image in FIG. 8(b) shows that the prepared functionalized nano probe has a structure comprising sequentially a carbon nanocone, TiN, and a W needle tip from the outside to the inside. The result of X-ray energy spectroscopy (EDX) analysis in FIG. 8(d) confirms the existence of the filler TiN. The TiN obtained in the present Example exists in the form of a thin film on the inner surface of the carbon nanocone, and forms a good contact with the carbon nanocone.

Example 8

Figure 1A:
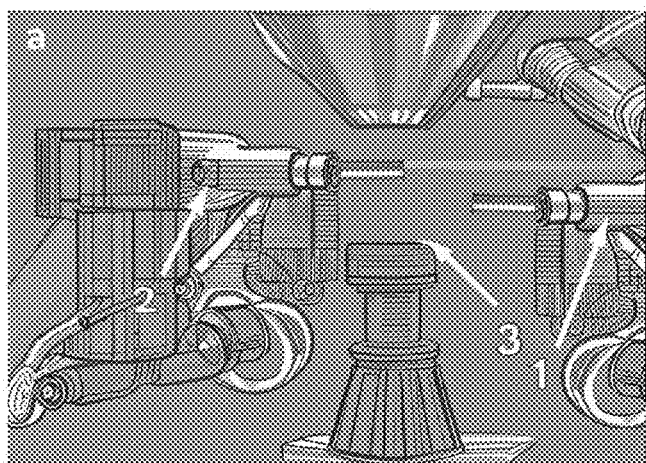
FIG. 1(a) is a photo of the actual micro operation system installed in a scanning electron microscope, 1 and 2 are micro manipulator arms, and 3 is a sample stage.
Figure 1B:
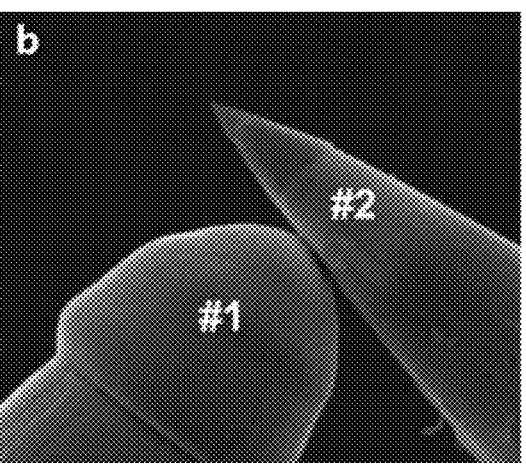
FIG. 1(b) is a scanning electron micrograph of a carbon nanocone functionalized nano-needle tip prepared by heating the metal needle tip #2 with an instantaneous electric current after the metal body #1 with a spherical top end contacts the metal needle tip #2.

In the present Example, a carbon nanocone material was dispersed in o-dichlorobenzene solvent by ultrasonic, and the obtained dispersion was deposited on a silicon wafer substrate by using a spin coater, then the silicon wafer substrate was mounted on a sample stage 3 of a scanning electron microscope, and the tungsten needle tips #1 and #2 were installed on a needle tube at the front end of the micro manipulator arms 1 and 2 in FIG. 1(a), respectively. The three-dimensional spatial movement of the tungsten needle tips in the sample chamber of the scanning electron microscope was realized by controlling the micro manipulator arms.

The tungsten needle tip #1 was moved, so that the tip end of the tungsten needle tip #1 lightly touched the tungsten needle tip #2 at the position 50 μm away from the tip end of the tungsten needle tip #2 to form a path. The tip end of the tungsten needle tip #1 was immediately melted into a 2 μm spherical structure by applying a bias voltage of 50 V. Then, the tungsten needle tip #2 was controlled by the micro manipulator arm such that the needle tip slowly approached the carbon nanocone deposited on the substrate, to be inserted into the tail of a carbon nanocone, and the needle tip was lifted upward such that the carbon nanocone slowly left the substrate. The molten tungsten metal spherical surface of the tungsten needle tip #1 was brought into contact with the side of the metal needle tip #2 at the position 2 μm away from the tip end of the metal needle tip #2 through the micro manipulator arm. A voltage was applied to the two tungsten needle tips to generate an electric current of 3 A for 0.25 ms, to obtain a carbon nanocone functionalized tungsten needle tip.

The prepared carbon nanocone functionalized tungsten needle tip #2 was taken out, fixed on a sample stage of a magnetron sputtering equipment, and coated with a 5 nm thick ZnO film on the surface (purity of magnetron sputtering ZnO target material: 99.99%). FIG. 9(a), FIG. 9(b) and FIG. 9(c) show TEM photos of the present Example. The high-resolution image in FIG. 9(b) shows that the prepared functionalized nano probe has a structure comprising sequentially a ZnO film, a carbon nanocone, and a W needle tip from the outside to the inside. The result of X-ray energy spectroscopy (EDX) analysis in FIG. 9(d) confirms the existence of ZnO.

Example 9

A 20 mL sample vial was taken, 25 mg of scandium acetate was firstly added, then 10 mL of ethylene glycol was added, and the resultant was subjected to ultrasonic treatment for 10 min to mix the above agents uniformly. A magnet was put in the sample vial, which was then lightly capped with a lid, and placed on a heating stirrer, the mixture was heated for 30 min at a temperature of 100° C. under a stirring rate of 500 rpm, such that scandium acetate was completely dissolved. Then, 2 mg of carbon nanocone was weighed and added into the above solution, the sample vial was lightly capped with a lid, and placed on a heating stirrer, the solution was heated for 18 h at a temperature of 100° C. under a stirring rate of 500 rpm, such that scandium acetate was filled into the tip end of the carbon nanocone. After the heating under stirring was finished, and the mixture was cooled to room temperature, then the mixture was filtered with a hydrophilic filter membrane with a pore size of 1 μm, the filtered sample together with the filter membrane was baked under an infrared lamp at a baking temperature of 80° C. for 20 h. The sample was scraped off the filter membrane, and a small amount of the sample was put in absolute ethanol, dispersed by ultrasonic, then dripped onto a copper microgrid for observation with transmission electron microscope (TEM). The TEM images of the filled carbon nanocones were shown in FIG. 10(a) and FIG. 10(b).

The filled carbon nanocones were dispersed in o-dichlorobenzene solvent by ultrasonic, and the obtained dispersion was deposited on a silicon wafer substrate by using a spin coater, then the silicon wafer substrate was mounted on a sample stage of a scanning electron microscope. Same as the above Examples, the tungsten needle tips #1 and #2 were installed on a needle tube at the front end of the micro manipulator arms 1 and 2, respectively. By controlling a micromanipulator, a carbon nanocone filled with scandium acetate was contacted and adhered. An electric current was applied to allow scandium acetate to decompose into scandium oxide, and meanwhile, a carbon nanocone functionalized nano needle tip filled with scandium oxide was prepared, and shown in FIG. 10(c) and FIG. 10(d). The scandium oxide obtained in the present Example exists in the form of nanoparticles or a thin film on the inner surface of the carbon nanocone, and forms a good contact with the carbon nanocone.

Although the general description, specific embodiments and experiments have been used to describe the present invention in detail above, some modifications or improvements can be made on the basis of the present invention, which is obvious to a person skilled in the art. Therefore, all these modifications or improvements made without departing from the spirit of the present invention belong to the protection scope of the present invention.

What is claimed is:

1. A preparation method of a carbon nanomaterial functionalized needle tip modified with a work function material, which is formed by combining a carbon nanomaterial with a material of a needle tip by means of a covalent bond, wherein when the interior of the carbon nanomaterial is modified with the work function material, wherein, the material of the needle tip is a metal which is one or more selected from tungsten, iron, cobalt, nickel, and titanium; the carbon nanomaterial is carbon nanocone; and the work function material is one or more selected from the group consisting of Ba, Ca, Yb, WC, HfC, NbC, TaC, $Ni_3C$, $LaB_6$, $CeB_6$, TiN, GaN, $Sr_3N_2$, $Ca@C_{82}$, $Lu_2C_2@C_{82}$, $Sc_3N@C_{80}$, BaO, ZnO, and $ZrO_2$, wherein the preparation method comprises:
(1) filling the interior of the carbon nanomaterial with the work function material; and
(2) assembling the carbon nanomaterial internally filled with the work function material to the tip end of the needle tip, and forming a firm interface connection between the carbon nanomaterial and the tip end of the needle tip by applying electric current or laser irradiation, wherein, a vacuum gas phase filling method, a melt phase filling method or a solution filling method is used to fill the interior of the carbon nanomaterial with the work function material, which comprises:

placing a carbon nanomaterial powder in a reactor, mixing and contacting the carbon nanomaterial powder with a vapor, molten liquid or solution of a compound of the work function material, reacting for 2 to 36 hours, then washing off the work function material not filled into the carbon nanomaterial with a solvent, filtering by a suction and diving a resultant.

2. The preparation method according to claim 1, wherein, depositing the carbon nanomaterial with the interior thereof filled with the work function material on a silicon wafer substrate by using a spin coater; adhering the tip end of the needle tip to the carbon nanomaterial, contacting the needle body with another metal body, applying a voltage between the metal body and the needle body, so that an electric current passes through the needle body, and the tip portion of the needle is heated and bonded with the adhered carbon nanomaterial.

3. The preparation method according to claim 2, wherein, the metal body has a spherical or platform-shaped top end;

the position where the metal body contacts with the needle body is 0.2 to 100 μm away from the top end of the needle tip; the material of both the metal body and the needle tip end is tungsten; and the electric current passing through the needle body is 0.04 to 4 A.

4. The preparation method according to claim 1, wherein the work function material is selected from the group consisting of Ba, Ca, Yb, $Ni_3C$, $CeB_6$, GaN, $Sr_3N_2$, $Ca@C_{82}$, $Lu_2C_2@C_{82}$, $Sc_3N@Co$, BaO, ZnO, and $ZrO_2$.

* * * * *